US006399440B1

(12) United States Patent
Miao

(10) Patent No.: US 6,399,440 B1
(45) Date of Patent: Jun. 4, 2002

(54) METHOD TO REDUCE THE NODE CONTACT RESISTANCE

(75) Inventor: Hui-Wen Miao, Taipei (TW)

(73) Assignee: Vanguard international Semiconductor Corporation (TW)

( * ) Notice: Subject to any disclaimer, the term of this patent is extended or adjusted under 35 U.S.C. 154(b) by 0 days.

(21) Appl. No.: 09/447,007

(22) Filed: Nov. 22, 1999

(51) Int. Cl.⁷ .......................................... H01L 21/8242

(52) U.S. Cl. ...................... 438/255; 438/396; 438/656; 438/964

(58) Field of Search ................................. 438/255, 259, 438/262, 263, 264, 964, 396, 239, 423, 430, 656, 288, 523, 514, 238

(56) References Cited

U.S. PATENT DOCUMENTS 6,165,830 A * 12/2000 Lin et al. ..................... 438/238

* cited by examiner

Primary Examiner—Charles Bowers
Assistant Examiner—Yennhu B. Huynh

(57) ABSTRACT

A process for eliminating an interface layer between a poly plug and a hemispherical silicon grain. A substrate comprising a conductive plug and a storage node opening is provided, and the storage node opening is located on the conductive plug. Then, a first conductive layer is formed conformably over the inside surface of the storage node opening and a hemispherical silicon grain layer is formed on the first conductive layer. Next, the hemispherical silicon grain layer and the first conductive layer is implanted and the substrate is annealed. The re-arrangement and re-crystallization of the interface layer can greatly reduce the resistance of the node contact.

19 Claims, 3 Drawing Sheets

METHOD TO REDUCE THE NODE CONTACT RESISTANCE

FIELD OF THE INVENTION

The present invention generally relates to a method for reducing the resistance of the node contact, particularly relates to a method of eliminating an interface layer between a conductive plug and a hemispherical silicon grain layer.

BACKGROUND OF THE INVENTION

As the semiconductor memory device becomes more highly integrated, the area occupied by a capacitor of a DRAM storage cell typically shrinks and it will cause the capacitance reduce of the capacitor. Owing to the leakage current, however, it is necessary to refresh the capacitor continuously in order to keep the stored state, especially when the capacitance of the capacitor is limited. Furthermore, the area reduction of the capacitor occupied will cause the capacitor to be disturbed by the alpha particle more easily.

Until now, there has been much effort directed to keep a relatively large capacitance of the capacitors in order to achieve a high signal-to-noise ratio in reading the memory cell and to reduce soft errors (due to alpha particle interference) as the memory device becomes highly integrated. As the followings, there are some approaches to increase the storage capability of the capacitor while the area occupied by the capacitor maintains small enough. (1) substituting a high capacitance material for traditional material to increase the storage charges per unit area of the capacitor, for example: the substitution the of $Ta_2O_5$ and $TiO_2$ for $SiO_2$. (2) decreasing the dielectric layer thickness of the capacitor: because of the Fowler-Nordheimn tunneling effect, the dielectric layer thickness is limited to a minimum value and one can not improve the capacitor too much by this method. (3) variation the shape of the capacitor electrodes: the capacitor may have protrusions, cavities, etc., to increase the surface area of the capacitor electrode. (4) increasing the contact area between the conductive layer implementing the electrode of the capacitor and the dielectric layer: the surface between the dielectric layer and the conductive layer can be varied to a ragged type surface and not be even a plain surface anymore.

The aforementioned third approach, it has been widely used and a crown-shaped or an U-shaped capacitor has been developed. For the last one method, one type of the surface variation is a ragged polysilicon layer. The combination implementing these two methods is as following description.

Referring FIG. 1, a polysilicon layer 12 is formed in the dielectric layer 15 which has been deposited on the substrate 10. Then, a dielectric layer 14 is deposited and an opening 18 is created by etching process with well-known lithography. After the etching process, a thin oxide layer 16 will exist usually on the bottom surface of the opening 18. Referring FIG. 2, a polysilicon layer 13 is deposited on the dielectric layer 14 and then a hemispherical silicon grain (HSG) layer 11 is formed on the polysilicon layer 13. Forming a dielectric layer 18 on the HSG layer 11 is followed by forming a conductive layer 17 on the dielectric layer 18.

Although combination of the crown-shaped capacitor and the ragged polysilicon layer effectively reduces the contact resistance, the existing of the native oxide layer 16 actually increases the contact resistance. The high contact resistance of the capacitor will lower the effectiveness of the memory cell, for example the program current is high (the lowest limit current to write a signal into the memory), the read current is low (the signal read from the memory) and the program speed is slow.

Therefore, it is really required to reduce the native oxide layer as little as possible and thereby all the high cell integration, the effective operation and reliable operation could be achieved simultaneously.

SUMMARY OF THE INVENTION

The present invention provides a manufacturing process for reducing contact resistance.

Another object of the present invention is to provide a method for eliminating an interface layer between a poly plug and a hemispherical silicon grain.

In the present invention, a substrate comprising a conductive plug and a storage node opening is provided, and the storage node opening is located on the conductive plug. Then, a first conductive layer with a thickness between about 500 to 1000 angstroms is formed conformably over the inside surface of the storage node opening. Next, a hemispherical silicon grain layer with a thickness range from about 300 to 600 angstroms is formed on the first conductive layer.

The hemispherical silicon grain layer and the first conductive layer above the surface of the conductive plug is implanted with phosphorus, the dose is about 1E15 to 1E16 atoms/$cm^2$. The grains at the interface layer between hemispherical silicon grain and conductive plug become amorphous due to the bombardment of the implanted impurities. The substrate is annealed in the temperature range from about 800 to 1000° C., and the interface atoms are re-crystallized in the annealing process. The re-crystallization of the interface layer can greatly reduce the resistance of the node contact. Finally, a dielectric layer is deposited on the hemispherical silicon grain and a second conductive layer, as another electrode of the capacitor, is formed on the dielectric layer.

BRIEF DESCRIPTION OF THE DRAWINGS

The objects, features and advantages of the present invention will be apparent from the following more particularly description of the invention illustrated in the accompanying drawings, in which.

DETAILED DESCRIPTION OF THE PREFERRED EMBODIMENT

Figure 1:
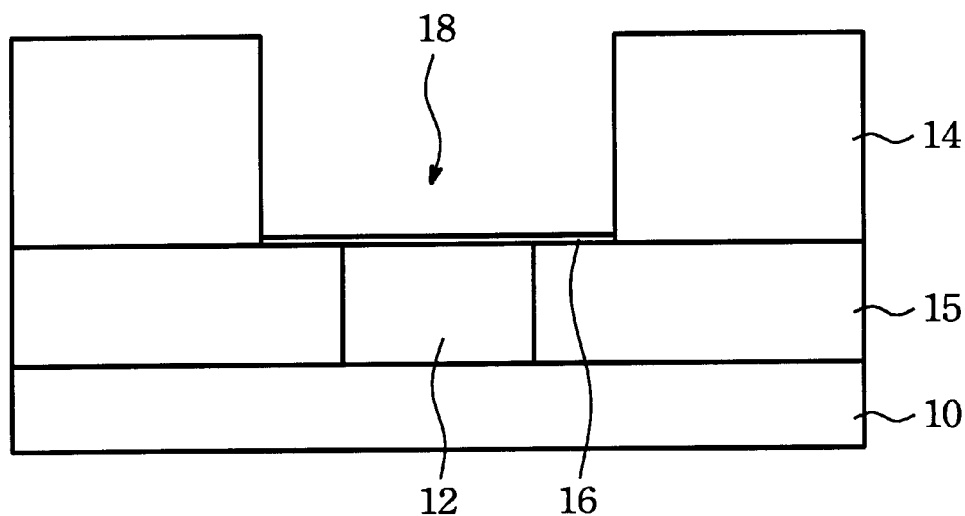
FIG. 1 is a cross sectional view illustrating the step of forming an opening in the semiconductor substrate in the prior art.
Figure 2:
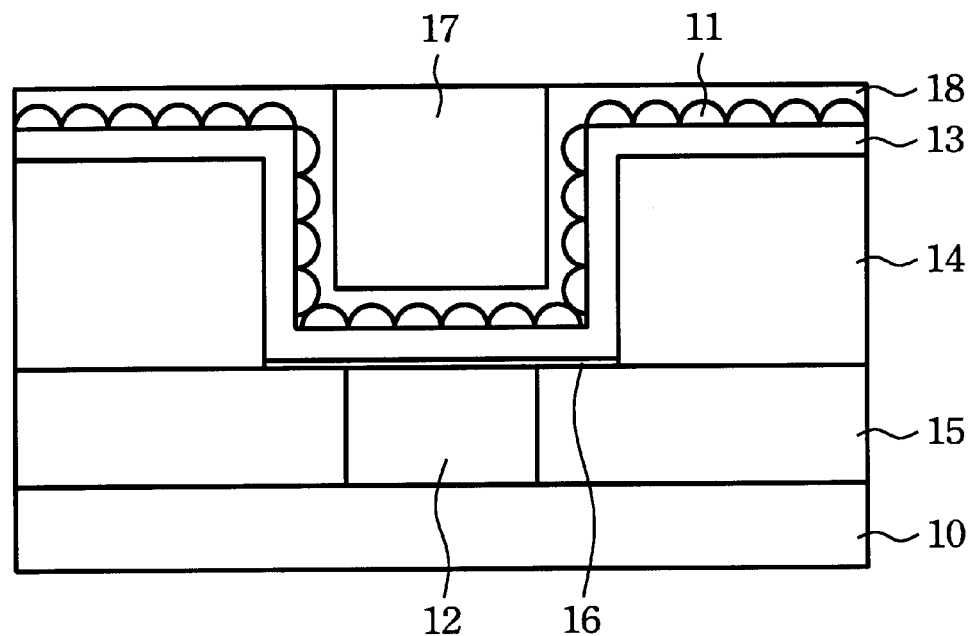
FIG. 2 is a cross sectional view of a semiconductor substrate illustrating the steps of forming the capacitor in the prior art.

Hereinafter, the preferred embodiments of the invention will be described with reference to accompanying drawing wherein like reference numerals designate like parts, respectively.

Figure 3:
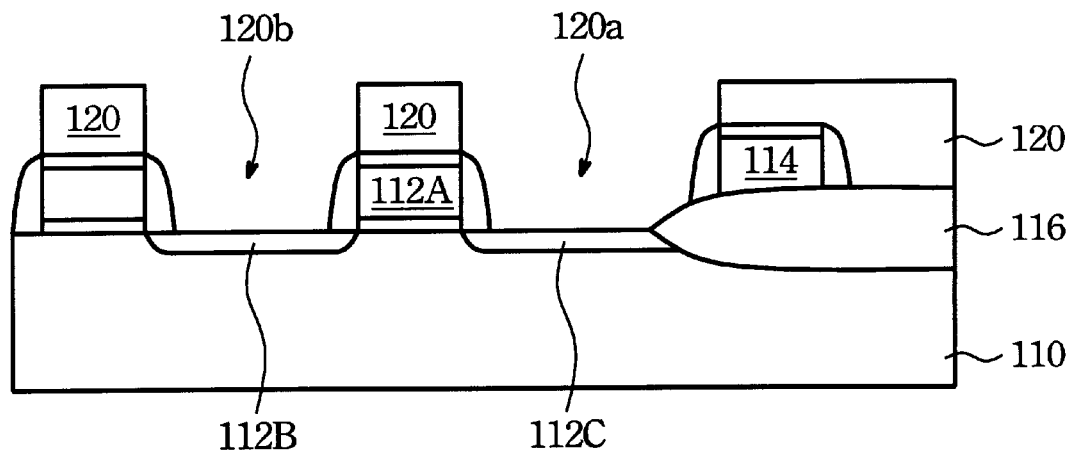
FIG. 3 is a cross sectional view of a semiconductor substrate illustrating the steps of forming two contact holes in accordance with the present invention.

Referring to FIG. 3, a metal-oxide-semiconductor field effect transistor (MOSFET) having a gate 112A, a drain 112B and a source 112C, is conventionally formed in and on the substrate 110.

Next, a first dielectric layer 120, such as an undoped oxide layer, a doped silicon oxide layer or a boro-phosphosilicate glass (BPSG) layer, is deposited over the substrate 110 in order to serve as the main insulation layer between conductive layers or conductive regions. The first dielectric layer 120 is typically deposited with a conventional low pressure chemical vapor deposition (LPCVD) or plasma enhanced chemical vapor deposition (PECVD). The thickness of this first dielectric layer 120 can be ranged from about 3000 to 6000 angstroms. After the first dielectric layer 120 is deposited, it can then be planarized using any suitable conventional method such as an etch back process or a chemical mechanical polishing (CMP) process.

A process of removing a portion of the first dielectric layer 120 is performed to define a contact hole 120a within the first dielectric layer 120, and make the contact hole 120a be extended down to a source region 112c in the substrate 110. A typical process including lithography and etching approach is employed to define the contact hole 120a. In the preferred embodiments, a bit line contact hole 120b is defined simultaneously with the contact hole 120a for a storage node.

Figure 4:
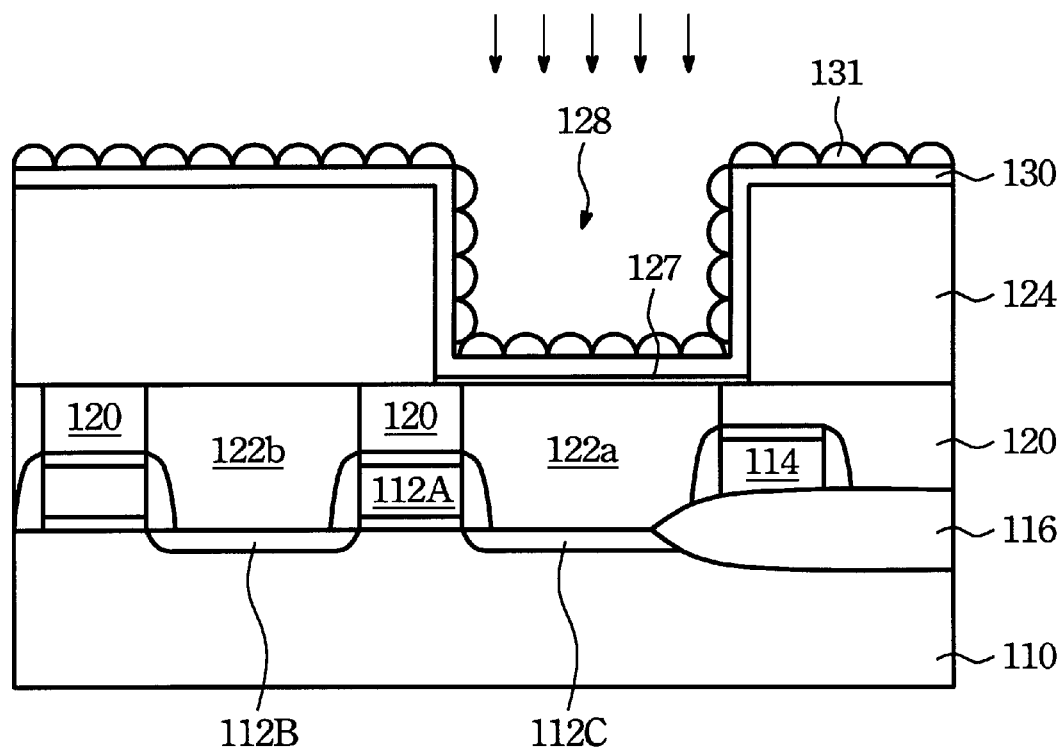
FIG. 4 is a cross sectional view of a semiconductor wafer illustrating the steps of implanting the hemispherical silicon grain and the conductive layer in accordance with the present invention.
Figure 5:
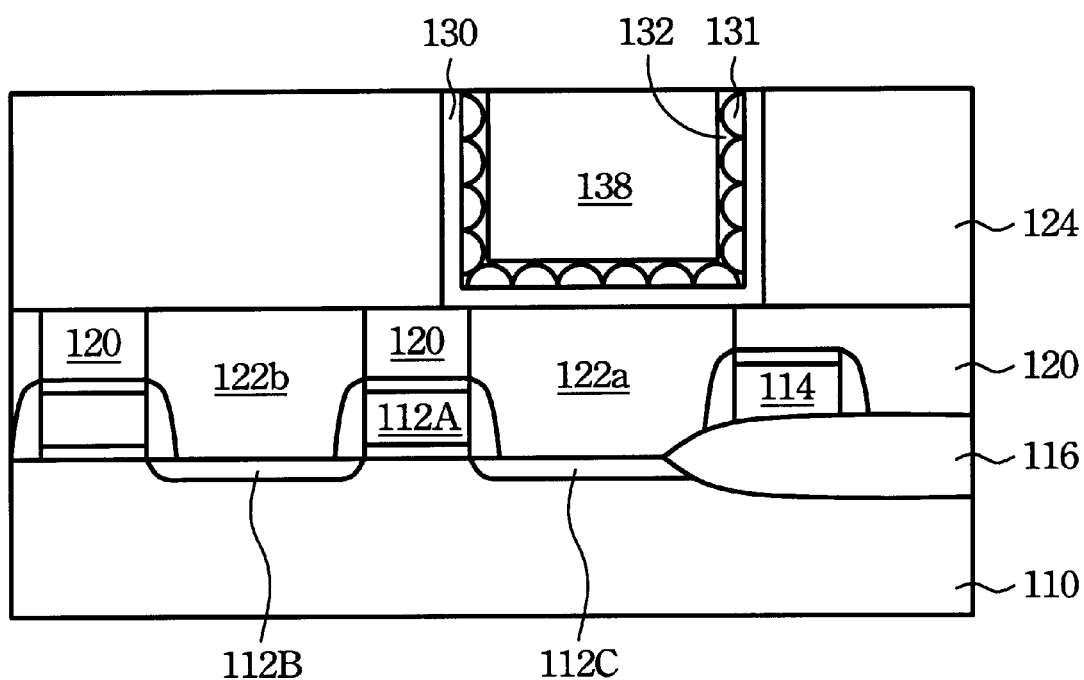
FIG. 5 is a cross sectional view of a semiconductor wafer illustrating the steps forming the capacitor in accordance with the present invention.

Turning to FIG. 4, a conductive plug 122a is formed and also communicated to the source region 112c within the contact hole 120a. The conductive plug 122a is preferably a polysilicon plug, which is formed by depositing and etching-back a polysilicon layer. Another conductive plug 122b is formed within the bit line contact hole 120b at the same time.

Then, a second dielectric layer 124 is formed on the first dielectric layer 120 and the conductive plugs 122a and 122b. In the preferred embodiments, a silicon oxide layer is employed as the second dielectric layer 124, and the silicon oxide layer is preferably deposited with conventional chemical vapor deposition technique like low pressure chemical vapor deposition (LPCVD) or plasma enhanced chemical vapor deposition (PECVD) process. The thickness of the silicon oxide layer 124 is between about 3000 to 7000 angstroms in the case.

Next, a series of steps are carried out to remove portions of the second dielectric layer 124 to define a storage node opening 128, within the second dielectric layer 124, as shown in FIG. 4. For communicating the bottom electrode of the capacitor, the storage node opening 128 is located over the conductive plug 122a. The steps for forming the storage node opening 128 typically includes the lithography process and a following etch step.

After the silicon surface of the conductive plug 122a is exposed, a native oxide is usually presented on the surface of the conductive plug 122a. This interface layer 127 will greatly increase the contact resistance of the conductive plug 122a. Thus, there will be a treatment of the interface layer 127 during the following embodiment in the invention.

A first conductive layer 130 is formed to conformably cover on the surfaces inside the storage node opening 128 and also cover on the second dielectric layer 124. The first conductive layer 130 can be an amorphous silicon layer. In the preferred embodiments, the first conductive layer 130 is a doped polysilicon layer, for example, using a standard chemical vapor deposition process with in-situ doped n-type dopants, in order to serve as the bottom electrode of the capacitor. In the preferred embodiments, the thickness of the first conductive layer 130 is between about 500 to 1000 angstroms.

A hemispherical silicon grain (HSG) layer 131 is then deposited on the first conductive layer 130. The hemispherical silicon grain (HSG) layer 131, which is preferably an undoped silicon layer, forms size with the diameter ranging from about 300 to 600 angstroms in the case.

In the preferred embodiments of forming hemispherical grained silicon layer 131, a seed layer may be needed for the formation of grain silicon. A thin titanium nitride (TiN) layer can be conformably formed on the first conductive layer 130 with suitable processes. In this embodiment, a low pressure chemical vapor deposition (LPCVD) is preferably used to achieve excellent conformity and thickness controllability. The TiN layer is preferably deposited to a thickness between about 100 to 300 angstroms, while the thickness can range from about 50 to 1000 angstroms in different cases.

Having the TiN layer as a seed layer, the nucleation sites in forming the HSG layer 131 are provided. In the case without employing the TiN layer, silicon particles on the surface of the first conductive layer 130 can also be employed as the nucleation sites in the conventional techniques for forming the HSG layer 131. During forming the HSG layer 131 deposited HSG polysilicon nucleates on the surface of the seed layer, or in the gas phase, to form a great number of polysilicon nodules over the surface of the first conductive layer 130. While the polysilicon deposition is continued further, these nodules grow to become grains as shown in FIG. 4. It is noted that a low temperature of about 250° C. to 350° C. is sufficient to form the HSG silicon layer 131 using plasma enhanced chemical vapor deposition (PECVD) in the preferred embodiment. A higher temperature of about 500–650° C. may be necessary in forming HSG silicon using the conventional technique, such as low pressure chemical vapor deposition (LPCVD). The size of the hemispherical silicon grain is about 300~600 angstroms in diameter.

Referring FIG. 4, the hemispherical silicon grain (HSG) layer 131 and the first conductive layer 130 on the bottom of the storage node opening 128 is implanted with dopants. For the preferred embodiment of the invention, the dopant is phosphorus for NMOS. The grains at the interface layer 127 between HSG and conductive plug 122a become amorphous due to the bombardment of the implanted impurities. Next, the interface atoms re-crystallize in the annealing process and the annealing temperature is preferred in the range of about 800~1000° C. The re-crystallization of the interface layer 127 can greatly reduce the resistance of the node contact.

In the preferred embodiment of the present, the third dielectric layer 132, i.e. the dielectric film of the capacitor can be stacked ONO, silicon nitride, $Ta_2O_5$, $TiO_2$, BST, or PZT and the thickness of about 40~80 angstroms.

Subsequently, a second conductive layer 138 of the capacitor is formed over the third dielectric layer 132, in a manner of totally filling up the space inside the recessed region within the third dielectric layer 132. And a planarizing step is performed to the substrate 110, preferably performed down to the surface of the third dielectric layer 132 for removing portions of the first conductive layer 130, HSG 131, the third dielectric layer 132 and second conductive layer 138. As an example, a chemical-mechanical polish (CMP) process is utilized for planarizing the substrate 110. The preferred embodiment according to the present invention, the second conductive layer 138 can be polysilicon, tungsten or aluminum and the thickness of the second conductive layer is about 1000~2000 angstroms.

From the above description, the present invention provides a method to reduce the resistance of a node opening.

Because the hemispherical silicon grain (HSG) layer 131 and the first conductive layer 130 on the bottom of the storage node opening 128 are implanted with dopants, the grains at the interface layer 127 between HSG and conductive plug 122a become amorphous. In the next annealing process, the atoms of the interface layer 127 are re-crystallized. Due to the implanting and the annealing steps in the present invention, the re-arrangement and the re-crystallization of the interface layer 127 can greatly reduce the resistance of the node contact.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

The embodiments of the invention in which an exclusive property or privilege is claimed are defined as follows:

1. A method of eliminating an interface between silicon layers, said method comprising the steps of:

forming a first silicon layer on a substrate;

forming a second silicon layer on said first silicon layer;

implanting said first silicon layer and said second silicon layer to make them become amorphous; and annealing said substrate to re-crystallize said first silicon layer and said second silicon layer to eliminate the interface between them.

2. The method according to claim 1, wherein said second silicon layer comprises hemispherical silicon grain.

3. The method according to claim 1, wherein said implanting step is performed with the dopants comprising phosphorus.

4. The method according to claim 1, wherein the implanting step is performed with the dose of about 1E15 to 1E16 atoms/cm$^2$.

5. The method according to claim 1, wherein the step of annealing said substrate is performed in the temperature range of 800~1000° C.

6. A method of reducing the resistance of a bottom electrode of a capacitor comprising the steps of:

providing a substrate comprising a conductive plug and a storage node opening, wherein the storage node opening is located on the conductive plug;

forming a silicon layer to conformably cover the inside surface of the storage node opening;

forming a hemispherical silicon grain layer on said first conductive layer;

implanting dopants into said hemispherical silicon layer and said silicon layer to make said hemispherical silicon layer and said silicon layer become amorphous; and annealing said substrate to recrystallize said hemispherical silicon layer and said silicon layer to eliminate the interface between them.

7. The method according to claim 6, wherein said first dielectric layer comprises a material selected from the group consisting of stacked oxide-nitride-oxide (ONO) film, silicon nitride, Ta$_2$O$_5$, TiO$_2$, BST (BaSiTiO$_3$), PZT (lead zirconate titanate).

8. The method according to claim 6, wherein the dopants comprise phosphorus.

9. The method according to claim 6, wherein the implanting step is performed with the dose of about 1E15 to 1E16 atoms/cm$^2$.

10. The method according to claim 6, wherein the step of annealing said substrate is performed in the temperature range of 800~1000° C.

11. A method of eliminating an interface between a hemispherical silicon grain layer and a silicon bottom electrode of a capacitor comprising the steps of:

forming a first dielectric layer on a substrate and a conductive plug on the substrate;

removing portions of said first dielectric layer to define a storage node opening within said first dielectric layer, and said storage node opening being located over said conductive plug;

forming a conformal silicon layer on the inside surface of said storage node opening and on said first dielectric layer;

forming said hemispherical silicon grain layer on said silicon layer;

implanting dopants into both said hemispherical silicon grain layer and said silicon layer to make them amorphous;

annealing the substrate to recrystallize said hemispherical silicon grain layer and said silicon layer to eliminate the interface between them;

forming a second dielectric layer conformably over said hemispherical silicon grain layer; and forming a conductive layer on said second dielectric layer.

12. The method according to claim 11, wherein said first dielectric layer comprises silicon oxide or silicon nitride.

13. The method according to claim 11, wherein said second dielectric layer comprises a material selected from the group of stacked oxide-nitride-oxide (ONO) firm, silicon nitride, Ta$_2$O$_5$, TiO$_2$, BST (BaSiTiO$_3$), PZT (lead zirconate titanate).

14. The method according to claim 11, wherein said silicon layer comprises doped polysilicon layer.

15. The method according to claim 11, wherein said hemispherical silicon layer has a thickness between about 500~1000 angstroms.

16. The method according to claim 11, wherein the dopants comprise phosphorus.

17. The method according to claim 11, wherein the step of implanting is performed with the concentration 1E15 to 1E16 atoms/cm$^1$.

18. The method according to claim 11, wherein the step of annealing said substrate is performed in the temperature range of 800~1000° C.

19. The method according to claim 11, wherein the step of implanting and the annealing can reduce the resistance of the node contact.

* * * * *